United States Patent [19]
Garrett et al.

[11] Patent Number: 5,826,215
[45] Date of Patent: Oct. 20, 1998

[54] METHOD AND COMPUTER PROGRAM PRODUCT FOR STABLE INTEGRAL EQUATION MODELS

[75] Inventors: Jan Elizabeth Garrett, Rochester, Minn.; Albert Emil Ruehli, Chappaqua, N.Y.

[73] Assignee: International Business Machines Corporation, Armonk, N.Y.

[21] Appl. No.: 783,218

[22] Filed: Jan. 14, 1997

[51] Int. Cl.$^6$ ................................................ G06G 7/19
[52] U.S. Cl. ........................... 702/75; 702/57; 364/489
[58] Field of Search ................................ 364/482, 488, 364/489; 702/57, 75

[56] References Cited

PUBLICATIONS

A.E. Ruehli, "Equivalent Circuit Models for Three Dimensional Multiconductor Systems," IEEE Transactions on Microwave Theory and Techniques, MTT–22(3):216–221, Mar. 1974.

Rubin et al., "Radiation and Scattering from Structures Involving Finite–Size Dielectric Regions," IEEE Transactions on Antennas and Propagation, 38(11):1863–1873, Nov. 1990.

Garrett et al., "Efficient Frequency Domain Solutions for SPEEC EFIE for Modeling 3d Geometries," Proc. of the Intl. Zurich Symp. on Electromagnetic Compatibility, pp. 179–184, Zurich, Switzerland, Mar., 1995.

Weeks et al., "Algorithms for ASTAP—A Network Analysis Program", IEEE Transactions on Circuits Theory, CT–20(11):628–634, Nov. 1973.

Gomez et al., "Time–Domain Integral Equation Methods for Transient Analysis", IEEE Antenna and Propagation Magazine, 34(3):15–22, Jun. 1992.

Sadigh et al., "Treating the Instabilities in Marching–on–in–Time Method from a Different Perspective", IEEE Transactions on Antennas and Propagation, APP–41(12): 1695–1702, Dec. 1993.

Ruehli et al., "Stability of Discretized Partial Element Equivalent EFIE Circuit Models", IEEE Transactions on Antennas and Propagation, 43(6): 553–559, Jun. 1995.

B.P. Rynne, "Comments on 'A Stable Procedure to Calculate the Transient Scattering by Conducting Surfaces of Arbitrary Shape'", IEEE Transactions on Antennas and Propagation, 41(4):517–520, Apr. 1993.

Ruehli et al., "Circuit Models for 3D Structures with Incident Fields", Proc. of the IEEE Int. Symp. on Electromagnetic Compatibility, pp. 28–31, Dallas, Texas, Aug. 1993.

Ruehli et al., "Circuit Models for Three–Dimensional Geometries Including Dielectrics," IEEE Transactions on Microwave Theory and Techniques, MTT–40(7): 1507–1516, Jul. 1992.

(List continued on next page.)

*Primary Examiner*—Emanuel Todd Voeltz
*Assistant Examiner*—Matthew Smithers
*Attorney, Agent, or Firm*—Joan Pennington

[57] ABSTRACT

A method and computer program product are provided for implementing a stable integral equation model for both the time and frequency domains. The stabilization method of the invention is applicable to electric field integral equation (EFIE) formulations, to magnetic field integral equation (MFIE) formulations, and to combined field integral equation (CFIE) formulations. For example, an EFIE formulation can be used in the circuit domain called partial element equivalent circuit (PEEC). Each volume cell is subdivided into a finite number of partitions. A partial inductance term is calculated consisting of a summation over all the finite number of partitions in each cell. Each surface cell is subdivided into a finite number of subcells. A coefficient of potential term is calculated consisting of a summation over all the finite number of subcells in each surface cell. Both the partial inductances and the coefficients of potential are calculated without increasing the number of unknowns. In addition, a damping resistor is added in parallel to the calculated partial inductance in each cell to reduce unwanted resonances outside the useful frequency range.

8 Claims, 14 Drawing Sheets

OTHER PUBLICATIONS

Garrett et al., "PEECE–EFIE for Modeling 3D Geometries with Lossy Inhomogeneous Dielectrics and Incident Fields," IBM Research Report RC 19245 (#83733), IBM T.J. Watson Res. Ctr., Yorktown Hts., Oct. 1993.

Rynne et al., "Stability of time Marching Algorithms for Electric Field Integral Equations," Journal of Electromagnetic Waves and Applications, JEWA–4(12):1181–1205, Dec. 1990.

Adve et al. "Extrapolation of Time Domain Responses from Three Dimensional Conducting Objects Utilizing the Matrix Pencil Technique," IEEE Transactions on Antennas and Propagation, submitted for publication.

A.E. Ruehli, "Inductance Calculations in a Complex Integrated Circuit Environment," IBM Journal of Research and Development,16(5):470–481, Sep. 1972.

L.W. Nagel, "SPICE: A computer Program to Simulate Semiconductor Circuits", Electr. Res. Lab. Report ERL M520, Univ. of CA, Berkeley, May 1975.

Rao et al., "The Application of the Conjugate Gradient Method to the Solution of Transient Electromagnetic Scattering from Thin Wires," Radio Science, vol. 19, No. 5, pp. 1319–1326 (Sep.–Oct. 1984).

Miller et al., "Direct Time–Domain Techniques for Transient Radiation and Scattering from Wires", Proc. of the IEEE, vol. 68, No. 11; pp. 1396–1423 (Nov. 1980).

PATCH
DIPOLE

LOOP FOLDED
DIPOLE

RIBBON FOLDED
DIPOLE

METHOD AND COMPUTER PROGRAM PRODUCT FOR STABLE INTEGRAL EQUATION MODELS

FIELD OF THE INVENTION

The present invention relates to the data processing field, and more particularly, relates to a method and computer program product for implementing a stable integral equation model for both the time and frequency domains. The stabilization method of the invention is applicable to electric field integral equation (EFIE) formulations, to magnetic field integral equation (MFIE) formulations, and to combined field integral equation (CFIE) formulations. An EFIE formulation is used in the circuit domain called partial element equivalent circuit (PEEC). In addition, the stabilization method of the invention is applicable to other numerical integration techniques.

DESCRIPTION OF THE PRIOR ART

The demand for electromagnetic (EM) modeling capability has increased considerably in the last few years. The modeling of electronic systems for electromagnetic compatibility (EMC) and electrical interconnect and packages (EIP) require efficient solution techniques for large problems which can accommodate a wide range of geometries. These methods should include both radiation as well as scattering formulations. An example of a scattering or incident field problem for electronic systems is the radiated electromagnetic susceptibility to radio and TV signals. These mixed EM and circuits problems are very challenging for electromagnetic formulations both in terms of problem size and complexity.

The Partial Element Equivalent Circuit (PEEC) technique is a circuit based formulation which is numerically equivalent to a full wave method of moments (MoM) solution with Galerkin matching. The Partial Element Equivalent Circuit (PEEC) approach is particularly useful for the modeling of an electromagnetic problem where a circuit interpretation can be used to find more appropriate solutions and where more insight can be gained into the solution process. The PEEC method is based on an Electric Field Integral Equation (EFIE) full wave formulation and it is a circuit domain extension of a Method of Moments (MoM) formulation. The basic PEEC formulation has recently been extended to include incident fields or scattering (sPEEC), dielectrics, lossy dielectrics, and the use of the modified nodal as well as the modified loop analysis (MLA) formulation.

The applicability of the PEEC model to both time and frequency domain problems is very useful. Very often, additional insight can be found from the analysis of a problem in both domains. Simple PEEC models which do not involve delays can be applied to both domains using a conventional circuit solver computer program, like SPICE or ASTAP. Instabilities for the time domain integral equation formulations for EM problems have been observed by many authors. Many different techniques have been suggested to overcome these instabilities including a conjugate gradient method, a filtering technique, and a matrix pencil technique to eliminate late time instabilities. While all of these techniques help eliminate some of stability problems for specific cases, some sources of instabilities remain.

A recent paper on stability by A. E. Ruehli et al., is entitled "Stability of Discretized Partial Element Equivalent EFIE Circuit Models", IEEE Transactions on Antennas and Propagation, 43(6):553–559, June 1995. In this paper, a potential stabilization scheme for the time domain was proposed using the PEEC interpretation of the integral equation. Each inductive self cell was subdivided into two series inductances and a delay $\tau_s$ was introduced between these two inductances. It was shown analytically for a small model how the roots of the system could be moved from the right half plane to the left half plane by the proper assignment of $\tau_s$. In this scheme the delays were adjusted to obtain a stable model. It was observed that the discretization of the continuous time EFIE leads to an unstable discrete system since the model has poles in the right half plane. For more complex problems, this stabilization scheme was insufficient.

It is known from circuit theory that the PEEC models without delays are passive and that they are always stable. Hence, it is evident that the instabilities are caused by the delays between the partial inductances and the coefficients of potential. An interesting fact is that well implemented MoM and PEEC formulations with delay do give the same response in the region of interest where the cells are chosen to be sufficiently small such that the cell size is at least 20 cells/$\lambda$. Note that impedance computations, like the ones considered in this specification, do require more cells for an accurate solution than do radiation problems.

In the present specification, an active frequency range is defined as a lower frequency range corresponding to a wavelength where all cells are of a size $\geq 20$ cells/$\lambda$. In models investigated for much higher frequencies corresponding to $\leq 20$ cells/$\lambda$, this frequency range is defined as an extended frequency range. The motivation for computations in the extended frequency range is the fact that a complex resonance behavior of the models are observed in this range. This may be totally irrelevant for a straight forward frequency analysis but is extremely important for other applications like the time domain. A need exists to eliminate the resonance behavior in the extended frequency range.

SUMMARY OF THE INVENTION

A principal object of the present invention is to provide an improved method and computer program product for implementing integral equation models using partial element equivalent circuit (PEEC). Other important objects of the present invention are to provide such method and computer program product substantially without negative effects and that overcome some disadvantages of prior art arrangements.

In brief, a method and computer program product are provided for implementing a stable integral equation model for both the time and frequency domains. The stabilization method of the invention is applicable to electric field integral equation (EFIE) formulations, to magnetic field integral equation (MFIE) formulations, and to combined field integral equation (CFIE) formulations. For example, an EFIE formulation can be used in the circuit domain called partial element equivalent circuit (PEEC). Each volume cell is subdivided into a finite number of partitions. A partial inductance term is calculated consisting of a summation over all the finite number of partitions in each cell. Each surface cell is subdivided into a finite number of subcells. A coefficient of potential term is calculated consisting of a summation over all the finite number of subcells in each surface cell.

In accordance with features of the invention both the partial inductances and the coefficients of potential are calculated without increasing the number of unknowns. In addition, a damping resistor is added in parallel to the calculated partial inductance in each cell to reduce unwanted resonances outside the useful frequency range.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
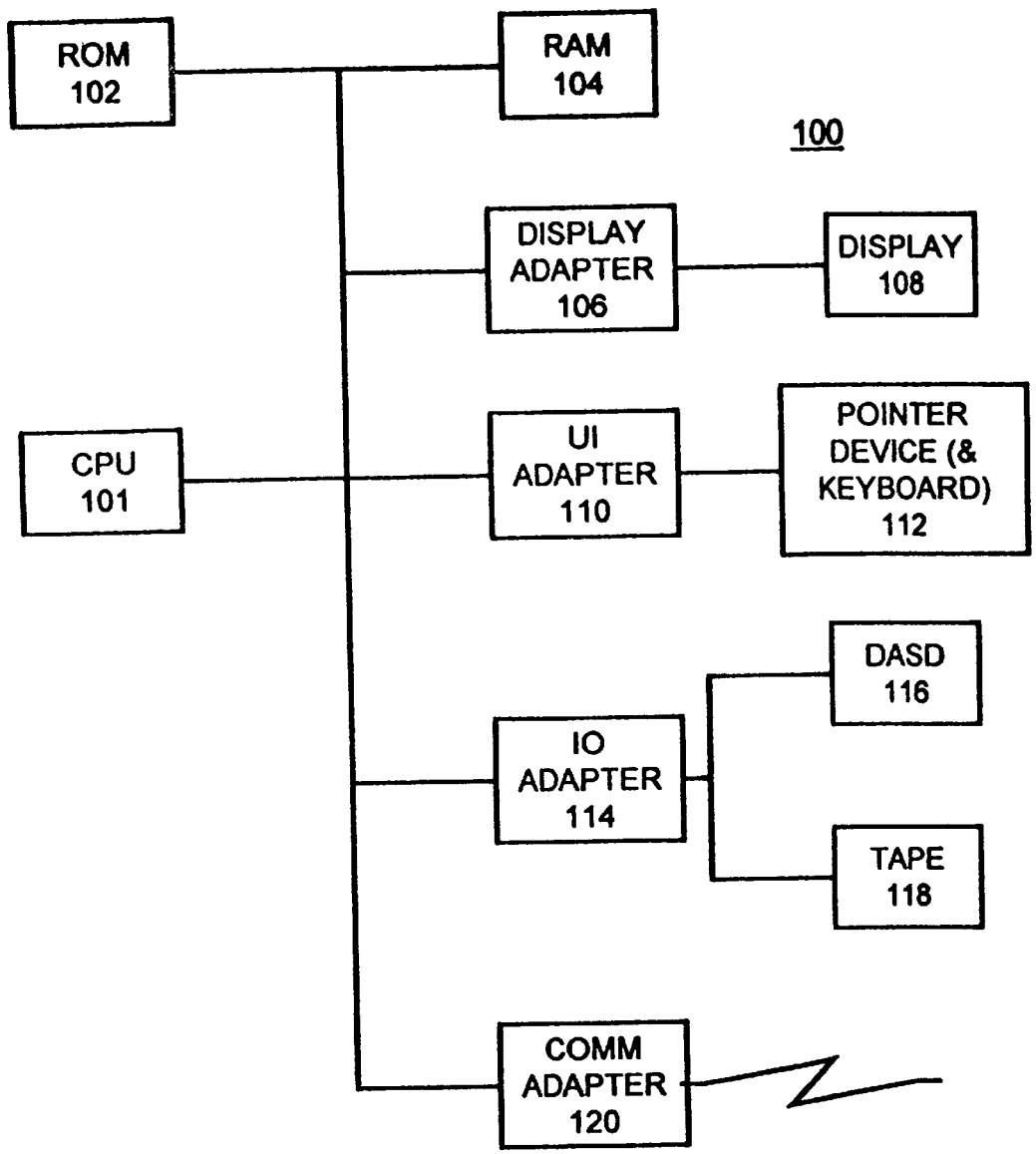
FIG. 1 is a block diagram representation of a computer or data processing system of the preferred embodiment.

Having reference now to the drawings, in FIG. 1 there is shown a computer or data processing system of the preferred embodiment generally designated by the reference character 100. As shown in FIG. 1, computer system 100 includes a central processor unit (CPU) 101, a read only memory 102, a random access memory 104, a display adapter 106 coupled to a display 108. CPU 101 is connected to a user interface (UI) adapter 110 connected to a pointer device and keyboard 112. CPU 101 is connected to an input/output (IO) adapter 114 connected to a direct access storage device (DASD) 116 and a tape unit 118. CPU 101 is connected to a communications adapter 120 providing a communications function.

Various commercially available processors could be used for computer system 100, for example, an IBM personal computer or similar workstation can be used. Central processor unit 101 is suitably programmed to execute the logic flowchart of FIG. 16 of the preferred embodiment.

In accordance with features of the invention, improvements are made to the PEEC model through the development of a refined method of computing both the partial inductances as well as the coefficients of potential without increasing the number of unknowns. The improved PEEC model of the present invention is referenced as +PEEC. In addition, damping is added to the PEEC model in order to reduce unwanted resonances outside the useful frequency range. The improved PEEC model of the present invention with added damping is referenced as R+PEEC. The effectiveness of the method is illustrated with several examples illustrated and described with respect to FIGS. 6–15. Also, in FIG. 6 the results of the present invention are compared with a conventional Method of Moments (MoM) code.

First a derivation of the PEEC models for both partial inductance and for coefficients of potential beginning with the electric field integral equation (EFIE). Next a derivation of the PEEC model improvements of the present invention is provided (+PEEC) and (R+PEEC).

Now an appropriate integral equation formulation is derived for the PEEC model. Then from this integral equation formulation both the partial inductance and the coefficient of potential terms are defined for the conventional PEEC model. The partial inductance and coefficient of potential terms defined for the conventional PEEC model provide the foundation for the improvements of the +PEEC model of the preferred embodiment.

The electric field in free space at a conductor can be written as $$j\omega\mu \int_{v'} G(\bar{r},\bar{r}')\bar{J}(\bar{r}')dv' + \frac{\nabla}{\epsilon_0} \int_{v'} G(\bar{r},\bar{r}')q(r')dv' = \bar{E}(\bar{r}) \qquad \text{(Eq. 1)}$$

where $\bar{J}$ is the current density in the conductor, q is the charge density, and G is the free space Green's function $$G(\bar{r},\bar{r}') = \frac{e^{-j\beta R}}{4\pi R} \qquad \text{(Eq. 2)}$$

where R is given by $R=|\bar{r}-\bar{r}'|$.

At the surface of a perfect conductor, $$\frac{\bar{J}}{\sigma} = 0,$$

and the tangential component of the electric field $\bar{E}=0$. This boundary condition is applied to the surfaces of the perfect conductor in Eq. 1 resulting in the following electric field integral equation $$0 = \hat{n} \times \left( j\omega\mu \int_{v'} G(\bar{r},\bar{r}')\bar{J}(\bar{r}')dv + \frac{\nabla}{\epsilon_0} \int_{v'} G(\bar{r},\bar{r}')q(r')dv' \right) S_{PEC} \qquad \text{(Eq. 3)}$$

where $\hat{n}$ is a vector normal to the surface of the conductor, and $S_{PEC}$ is surface of a perfect electrical conductor.

The unknown quantities J and q are assumed constant over a cell. The geometry should be discretized into small enough cells so that this assumption is valid. This is less of an issue for a full wave solution since the cells must be much smaller than the wavelength. In the PEEC formulation, both q and J are unknowns and are related by the continuity equation $\nabla \cdot J + j\omega q = 0$. The continuity equation is enforced by writing Kirchoff's current law (KCL) at each node. The vector quantities are discretized into orthogonal coordinates as $J = J_x \hat{x} + J_y \hat{y} + J_z \hat{z}$. Substituting this relationship into Eq. 1 will result in a set of three vector equations which are identical in form, but differ in spatial directions x, y, z. As an example, consider the current for the conductor shown in FIG. 2 which has been discretized into 2 volume cells α and β and 3 surface cells γ, δ, ζ.

Substitution of the z component of the current into the integral equation for this example results in $$0 = \qquad \text{(Eq. 4)}$$

$$\hat{n} \times \left( j\omega\mu \int_{v_\alpha'} G(\bar{r},\bar{r}')\bar{J}_z(\bar{r}')dv_\alpha' + j\omega\mu \int_{v_\beta'} G(\bar{r},\bar{r}')\bar{J}_z(\bar{r}')dv_\beta' + \right.$$

$$\frac{1}{\epsilon_0} \frac{\partial}{\partial z} \int_{S_\gamma'} G(\bar{r}, \bar{r}')q(r')dS_\gamma' +$$

$$\frac{1}{\epsilon_0} \frac{\partial}{\partial z} \int_{S_\delta'} G(\bar{r}, \bar{r}')q(r')dS_\delta' +$$

$$\left. \frac{1}{\epsilon_0} \frac{\partial}{\partial z} \int_{S_\zeta'} G(\bar{r}, \bar{r}')q(r')dS_\zeta' \right)_{onPEC}$$

As in any method of moments formulation, basis and testing functions are selected. In the PEEC formulation, there are two unknowns, current density $\bar{J}$ and charge q. Each unknown is expanded into a series of pulse basis functions with an unknown amplitude. Pulse functions are also selected for the testing functions for the Galerkin formulation at hand. The cell to cell coupling is defined with respect to cell $\alpha$ in FIG. 2 by integrating each term of the integral equation 3 over the volume $v_\alpha$ of conductor cell $\alpha$ in the following manner.

$$\frac{1}{a_\alpha} \int_{v_\alpha} f(r)dv = \frac{1}{a_\alpha} \int_{a_\alpha} \int_{1_\alpha} f(\bar{r})dad1 \quad \text{(Eq. 5)}$$

where $v_\alpha$ is the volume of the conductor cell $\alpha$, $a_\alpha$ is the cross-section of the cell (x-y direction) and $l_\alpha$ is the length (z-direction) and $f(\bar{r})$ is the integrand. We can view this either as the Galerkin solution or as averaging the field at point $\bar{r}$ over the cell volume $v_\alpha$.

Starting with the integral equation 4, the first 2 terms, or vector potential terms, are shown to correspond to partial inductances. Keeping in mind that the current density J is constant over each cell and $I_z = J_z \alpha_{cell}$, where $\alpha_{cell}$ is the cross sectional area of a cell, equation 4 becomes $$j\omega \frac{\mu}{a_\alpha} I_z \int_{v_\alpha'} G(\bar{r},\bar{r}')dv_\alpha' + i \frac{\omega\mu}{a_\beta} I_z \int_{v_\beta'} G(\bar{r},\bar{r}')dv_\beta' \quad \text{(Eq. 6)}$$

Now, by applying the equation 5, the vector potential terms in equation 6 become $$i \frac{\omega\mu}{a_\alpha a_\alpha} I_z \int_{v_\alpha'} \int_{v_\alpha} G(\bar{r},\bar{r}')dv_\alpha dv_\alpha' + \quad \text{(Eq. 7)}$$

$$\frac{jw\mu}{a_\beta a_\alpha} I_z \int_{v_\beta'} \int_{v_\alpha} G(\bar{r},\bar{r}')dv_\alpha dv_\beta'$$

The partial mutual inductance between cells $\alpha$ and $\beta$ is defined as $$Lp_{\alpha\beta} = \frac{\mu}{4\pi} \frac{1}{a_\alpha a_\beta} \int_{v_\alpha} \int_{v_\beta} \frac{1}{R} dv_\alpha dv_\beta \quad \text{(Eq. 8)}$$

Figure 2:
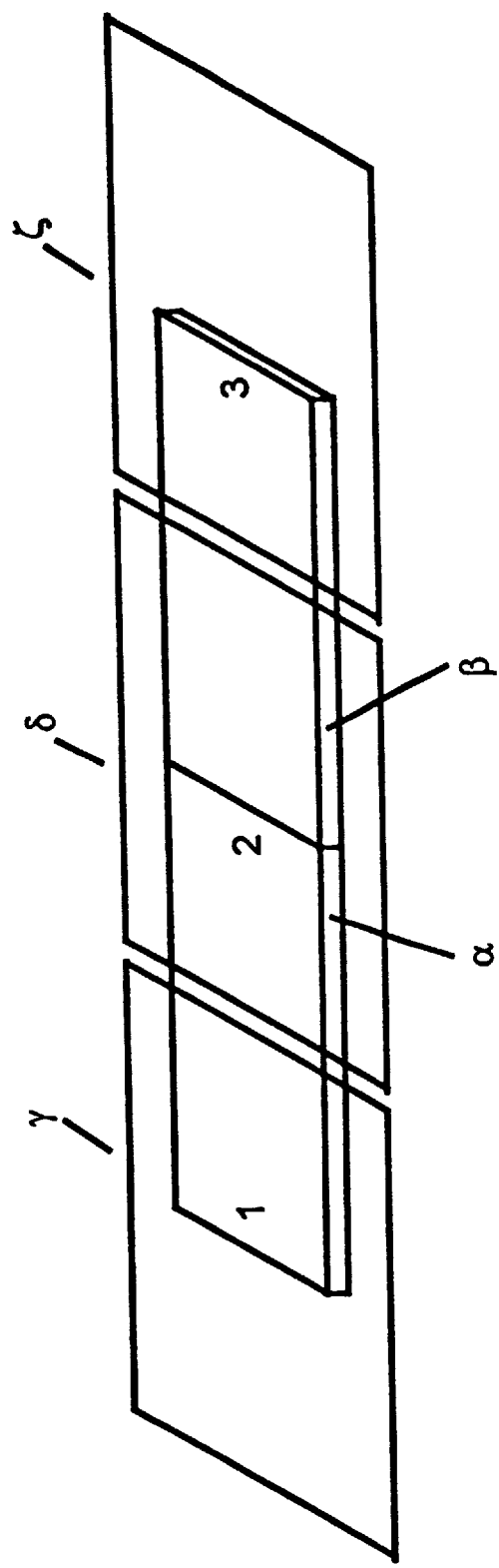
FIG. 2 is a diagram illustrating a conductor example that has been discretized in a PEEC formulation into two volume cells and three surface cells.

Using this definition and equation 2 for the Green's Function, equation 7 can be rewritten as $$j\omega Lp_{\alpha\alpha}I_\alpha + j\omega Lp_{\alpha\beta}I_\beta e^{-j\beta R}{\alpha\beta} \quad \text{(Eq. 9)}$$

where the first term is the partial self inductance of the cell $\alpha$ and the second term represents the inductive coupling to cell $\alpha$ from a current in cell $\beta$ in FIG. 2. The delay between cells $\alpha$ and $\beta$ are given by the phase term $e^{-j\beta R}{\alpha\beta}$ where $R_{\alpha\beta}$ is the center to center distance between cells $\alpha$ and $\beta$. In general, given n cells, the inductive coupling terms is $$j\omega Lp_{ii}I_i + \sum_{j=1, i \neq j}^{n} j\omega Lp_{ij}I_j e^{-j\beta Rij} \quad \text{(Eq. 10)}$$

In a similar manner, the coefficient of potential terms can be derived from the last 3 terms in equation 4. With the charge q is constant over each equation 4 becomes $$\frac{q\gamma}{\epsilon_0} \frac{\partial}{\partial z} \int_{S_\gamma'} G(\bar{r}, \bar{r}')dS_\gamma' + \quad \text{(Eq. 11)}$$

$$\frac{q\delta}{\epsilon_0} \frac{\partial}{\partial z} \int_{S_\delta'} G(\bar{r}, \bar{r}')dS_\delta' +$$

$$\frac{q\zeta}{\epsilon_0} \frac{\partial}{\partial z} \int_{S_\zeta'} G(\bar{r}, \bar{r}')dS_\zeta'$$

Now, by applying Eq. 5, we get $$\frac{q\gamma}{\epsilon_0} \int_{v_\alpha} \frac{\partial}{\partial z} \int_{S_\gamma'} G(\bar{r}, \bar{r}')dS_\gamma' dv_\alpha + \quad \text{(Eq. 12)}$$

$$\frac{q\delta}{\epsilon_0} \int_{v_\alpha} \frac{\partial}{\partial z} \int_{S_\delta'} G(\bar{r}, \bar{r}')dS_\delta' dv_\alpha +$$

$$\frac{q\zeta}{\epsilon_0} \int_{v_\alpha} \frac{\partial}{\partial z} \int_{S_\zeta'} G(\bar{r}, \bar{r}')dS_\zeta' dv_\alpha$$

The surface integral can be redefined at $$F(z) = \int_S G(\bar{r},\bar{r}')dS \quad \text{(Eq. 13)}$$

With this, each term in equation 12 can be rewritten in terms of the F(z)

$$\frac{q\gamma}{\epsilon_0} \int_{v_\alpha} \frac{\partial}{\partial z} F_\gamma(z)dv_\alpha + \quad \text{(Eq. 14)}$$

$$\frac{q\delta}{\epsilon_0} \int_{v_\alpha} \frac{\partial}{\partial z} F_\delta(z)dv_\alpha + \frac{q\zeta}{\epsilon_0} \int_{v_\alpha} \frac{\partial}{\partial z} F_\zeta(z)dv_\alpha$$

Each volume integral can be broken into 2 integrals $$\int_v \frac{\partial}{\partial z} F(z)dv = \int_a \int_z \frac{\partial}{\partial z} F(z)dz da \quad \text{(Eq. 15)}$$

The central difference approximation may be used to evaluate the derivative.

$$\frac{\partial}{\partial z} F(z) = \frac{\left(F\left(z + \frac{\Delta z}{2}\right) - F\left(z - \frac{\Delta z}{2}\right)\right)}{\Delta z} = \frac{F(z^+) - F(z^-)}{\Delta z} \quad \text{(Eq. 16)}$$

where $$z^+ = z + \frac{\Delta z}{2}$$

and similarly $$z^- = z - \frac{\Delta z}{2}.$$

With this result, equation 11 becomes $$\frac{q_\gamma}{S\gamma\epsilon_0} \int_{S_\gamma}\int_{S_{\gamma'}} G(\bar{r},\bar{r}')dS_{\gamma'}dS_\gamma + \quad \text{(Eq.17)}$$

$$\frac{q\delta}{S\gamma\epsilon_0} \int_{S_\gamma}\int_{S_{\delta'}} G(\bar{r},\bar{r}')dS_{\delta'}dS_\gamma +$$

$$\frac{q_\zeta}{S\gamma\epsilon_0} \int_{S_\gamma}\int_{S_{\zeta'}} G(\bar{r},\bar{r}')dS_{\zeta'}dS_\gamma$$

The definition of coefficient of potential is given in as $$p_{ij} = \frac{1}{S_iS_j} \frac{1}{4\pi\epsilon_0} \int_{S_i}\int_{S_j} \frac{1}{R}\, dS_j dS_i \quad \text{(Eq.18)}$$

The total charge on cell $\gamma$ is given by $Q_\gamma = q_\gamma a_\gamma$ where $a_\gamma$ is the surface area of cell $\gamma$. With this relationship and the coefficient of potential definition in Eq. 18, each term in Eq. 17 can be rewritten. The delay between cell $\alpha$ and cells $\gamma$, $\delta$, and $\zeta$ are given by the phase terms.

$$Q_\gamma P_{\gamma\gamma} + Q_\delta P_{\gamma\delta} e^{-j\beta R\gamma\delta} + Q_\zeta P_{\gamma\zeta} e^{-j\beta R\gamma\zeta} \quad \text{(Eq. 19)}$$

where $R\gamma\delta$ is the center to center distance between cells $\gamma$ and $\delta$.

Historically, PEEC models have been implemented using partial inductances and coefficients of potential as they are defined above in equations 8 and 18. As can be seen from these definitions, they are based on analytically integrating the 1/R dependence of the Green's function over the appropriate cells. The phase term of the Green's function is not included under the integral in order to be compatible with the time domain. Instead, the integration of the phase term is approximated by the evaluation at the centroid of each cell. This approximation provides very good answers for the frequency domain in comparison with other MoM methods. In addition, numerical rather than analytical integration would have been necessary if the phase terms had been included in equations 8 and 18 for the Galerkin solution.

Now a new way of calculating the partial inductance and coefficient of potential terms is derived in accordance with the present invention which also can be implemented both in the time as well as the frequency domain.

The partial inductance and coefficient of the potential terms have been derived from the PEEC interpretation of the EFIE. Next, in the enhanced PEEC model of the invention is developed which is called +PEEC, for notational convenience.

Figure 3:
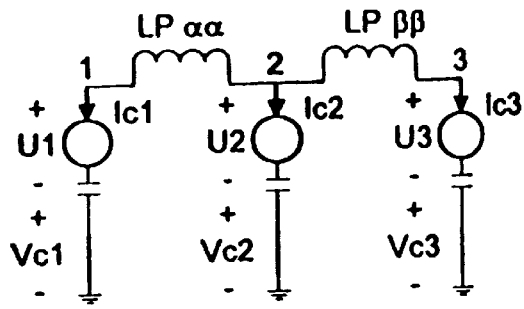
FIG. 3 is a diagram illustrating a PEEC model for the conductor example of FIG. 2 of the preferred embodiment.

The modified loop analysis (MLA) method is used to implement both the PEEC and +PEEC formulations. Using the MLA method, the PEEC model for the 2 cell conductor example of FIG. 2 is shown in FIG. 3. For this geometry, the MLA method is the most efficient implementation for PEEC in the frequency domain and it corresponds to the usual MoM impedance matrix for simple cases.

It is well known that for impedance problems, about 20 cells/$\lambda$ at $f_{max}$ is required for an accurate answer up to some maximum frequency $f_{max}$. It is clear that we could obtain a clean frequency response up to 50 $f_{max}$ by decreasing the cell size by about a factor 50 in both directions, but this increased range comes at the high price of an extremely large number of unknowns. In all our examples we chose $f_{max}$=20 GHz and we tried to obtain a clean model for the extended frequency range. The feature of +PEEC is that the behavior of the solution for frequencies in the extended frequency range is stabilized without increasing the number of unknowns. To achieve this feature, two changes were implemented in PEEC which are applied simultaneously to obtain the +PEEC model. These changes include improved partial inductances and coefficients of potential. Along with these model improvements, a third change is implemented through the introduction of damping resistors. This combined model with all three improvements is referred to as R+PEEC. Now the implementation of +PEEC and R+PEEC are described and results are illustrated in FIGS. 6–15 which show that +PEEC and R+PEEC stabilizes the PEEC models.

+PEEC and R+PEEC increase in accuracy of the phase behavior for the extended frequency range without introducing more unknowns. Having reference to the 2 cell example of FIGS. 2 and 3, each cell can be considered to be at the macromodel level. By subdividing each of these cells into a finite number of partitions, a new way of computing the inductance term for each cell at the macromodel level is introduced. By using the relationship in Eq. 10 for this 2 cell equation provides $$j\omega Lp_{11}I_1 + j\omega Lp_{12}I_2 ie^{-j\beta R}12$$

$$j\omega Lp_{22}I_2 + j\omega Lp_{21}I_1 ie^{-j\beta R}21 \quad \text{(Eq. 20)}$$

We can now subdivide each of these cells into a finite number of partitions given by $$\Delta = c/nf_e$$

where c is the speed of light in free space, n=1, 2, . . . , and $f_e$ is given by the upper end of the extended frequency range. In our example, we used $f_e$=1000 GHz. By allowing n to vary, the smallest number of partitions for each geometry can be selected such that the problem is stable, and the computational effort is minimized. Importantly, the unknown current for each cell is not further subdivided resulting in the same number of unknowns. This partitioning of each cell results in each partial inductance term consisting of a summation over all the partitions in each cell. For each cell, equation 8 becomes $$Lp_{ij}^t = \frac{\mu}{4\pi} \frac{1}{a_i a_j} \sum_{k=1}^{M_i}\sum_{kk=1}^{N_i}\sum_{q=1}^{M_j}\sum_{qq=1}^{N_j} e^{-j\beta R}k,kk,q, \quad \text{(Eq.21)}$$

$$qq \int_{a_k}\int_{l_{kk}}\int_{a_q}\int_{l_{qq}} \frac{1}{R}\, dl_{qq}da_q dl_{kk}da_k$$

where cell i is partitioned into $M_i$ by $N_i$ sections and cell j is partitioned into $M_j$ by $N_j$ sections. Cell i consists of a total of $M_iN_i$ partitions and cell j consists of a total of $M_jN_j$ partitions. The phase term is taken outside of the integral and is approximated by defining R as the distance between the centroid of partition k,kk and of partition q,qq.

Each partition now is treated the same as each cell. For example, where there was previously one calculation for a partial self inductance for cell i, now there are 4 summations over all $M_iN_i$ partitions contained within cell i. For the mutual terms, the calculation is similar in that there are 4 summations, where 2 summations are over the partitions due to cell i and 2 summations are over the partitions due to cell j as is shown in equation 21 of the preferred embodiment.

The computation of the partial self and partial mutual inductance terms has increased to the extent that $M_i N_i$ operations are required for each partial inductance term. However, the analytical integration is computed only for the self cell terms. For all mutual terms, the integral is approximated by 1/R using the centroid to centroid distance of each partition within each cell. Although the computation of the partial inductance terms has changed considerably with this scheme, the unknowns are the same as before.

In a similar manner, the coefficient of potential cells γ, δ, and ζ in FIG. 2 is partitioned into subcells. In general, for each pair of cells i and j, the coefficient of potential calculation with the delay term is replaced by $$p_{ij}^+ = \frac{1}{4\pi} \frac{1}{a_i a_j} \sum_{k=1}^{M_i} \sum_{kk=1}^{N_i} \sum_{q=1}^{M_j} \sum_{qq=1}^{N_j} e^{-j\beta R_{k,kk,q}}$$ (Eq.22)

$$qq \int_{w_k} \int_{l_{kk}} \int_{w_q} \int_{l_{qq}} \frac{1}{R} dl_{qq} dw_q dl_{kk} dw_k$$

where each partition has a width w and length l corresponding to the surface of each partition. Cell i is partitioned into $M_i$ by $N_i$ sections and cell j is partitioned into $M_j$ by $N_j$ sections. The phase term is again outside of the integral, but is approximated by defining R as the distance between the centroid of partition k,kk and of partition q,qq.

As before, the total number of PEEC capacitance models has not changed, but just the actual coefficient of potential calculation has changed. Therefore, the number of unknowns in the problem has not changed.

Figure 4:
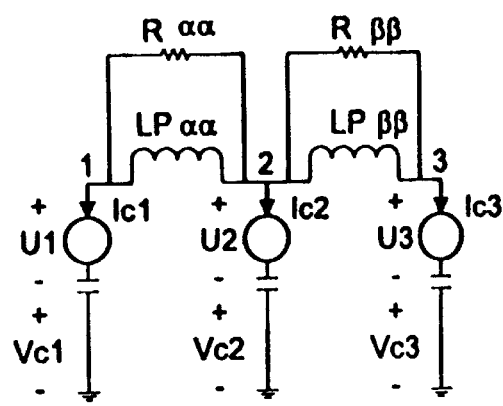
FIG. 4 is a diagram illustrating a PEEC model including damping resistors for the conductor example of FIG. 2 of the preferred embodiment.
Figure 5A:
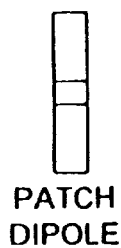
FIGS. 5A, 5B, and 5C illustrate three different geometries including a patch antenna and two different folded dipole antennas for computer experiments of the preferred embodiment.
Figure 5B:
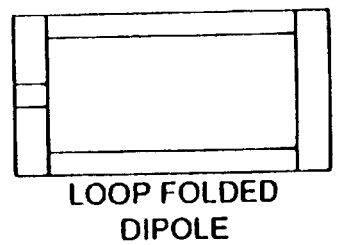
Figure 5C:
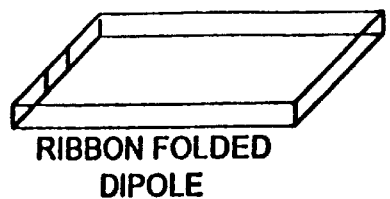

For computer experiments, three different geometries were used as shown in FIGS. 5A, 5B, and 5C including a patch antenna and two folded dipole antennas. These are quite different problems since the patch antenna is capacitive and the folded dipole antennas are inductive at low frequencies. A problem is unstable if the real portion of the input impedance is shown to be negative. By implementing the calculation of both the partial inductance and coefficients of potential of the preferred embodiment, the input impedance is positive for a much larger frequency range. In addition to this improvements provided by the +PEEC method, the useful frequency range is further extended, without introducing more unknowns, by the addition of a damping resistor Rαα, Rββ in parallel with the partial inductance, as shown in FIG. 4. The PEEC and +PEEC methods are powerful because circuit techniques can be used to interpret and analyze problems.

With the added damping resistor in parallel to the partial inductances, the R+PEEC model is provided. Since each loop current through the partial inductance is an unknown, by adding the parallel resistor, one additional loop current is added for each existing unknown. The challenge is to implement this parallel resistance without changing the size of the matrix, i.e., the number of unknowns. The unknown loop current in cell α is given by $I_\alpha$. This loop current can be written in terms of the currents through the inductor and resistor in loop α as $I_\alpha = I_{R_{\alpha\alpha}} + I_{L_{p_{\alpha\alpha}}}$. The parallel impedance is given by $$\frac{SLp_{\alpha\alpha} R_{\alpha\alpha}}{sLp_{\alpha\alpha} + R}$$ (Eq.23)

By using this parallel impedance, we do not introduce an additional unknown into the MLA matrix. In general, the stamp would be of the following form for a given current $I_{Lk}$ going through the kk-th partial inductance.

| Row | ... | $I_{Lk}$ | ... | RHS |
|---|---|---|---|---|
| k | 0 | $\frac{\alpha_k}{s+\alpha_k} Lp_{kk}^S$ | 0 | 0 |

The stamp would be of the following form for the coupling of the current $I_{Ln}$ into each of the other partial inductance terms.

| Row | ... | $I_{Ln}$ | | ... | RHS |
|---|---|---|---|---|---|
| k | ... | $\frac{\alpha_n}{s+\alpha_n}$ | $\frac{\alpha_k}{s+\alpha_k} Lp_{nk} s e^{-sTLnk}$ | 0 | 0 | where $$\alpha_n = \frac{R_n}{Lp_{nn}} \text{ and } \alpha_k = \frac{R_k}{Lp_{kk}}.$$

The actual value of the damping resistor is calculated for each cell using the following equation $$R_{ii} = k\omega_{max} Lp_{ii}$$ (Eq. 24)

where $\omega_{max} = 2\pi f_{max}$, and k=10, ... 100, depending on the problem. Using this equation for R, k may be adjusted such that R dominates at frequencies greater than $f_{max}$, but not at frequencies lower than $f_{max}$.

The +PEEC and the R+PEEC improvements to the basic PEEC model in Section 3 are result of extensive computer experiments. Also, the fact that the techniques must be applicable both in the frequency as well as the time domain is a key constraint in accordance with the preferred embodiment. Having reference to FIGS. 6–15, experimental evidence of the benefits of the +PEEC and the R+PEEC model improvements is provided. We discretize each example for 20 cells/λ for the active frequency range. For each example, the active frequency range is given by $f_{max}$=20 GHz, and the extended frequency range is given by $f_e$=1000 GHz.

Figure 6:
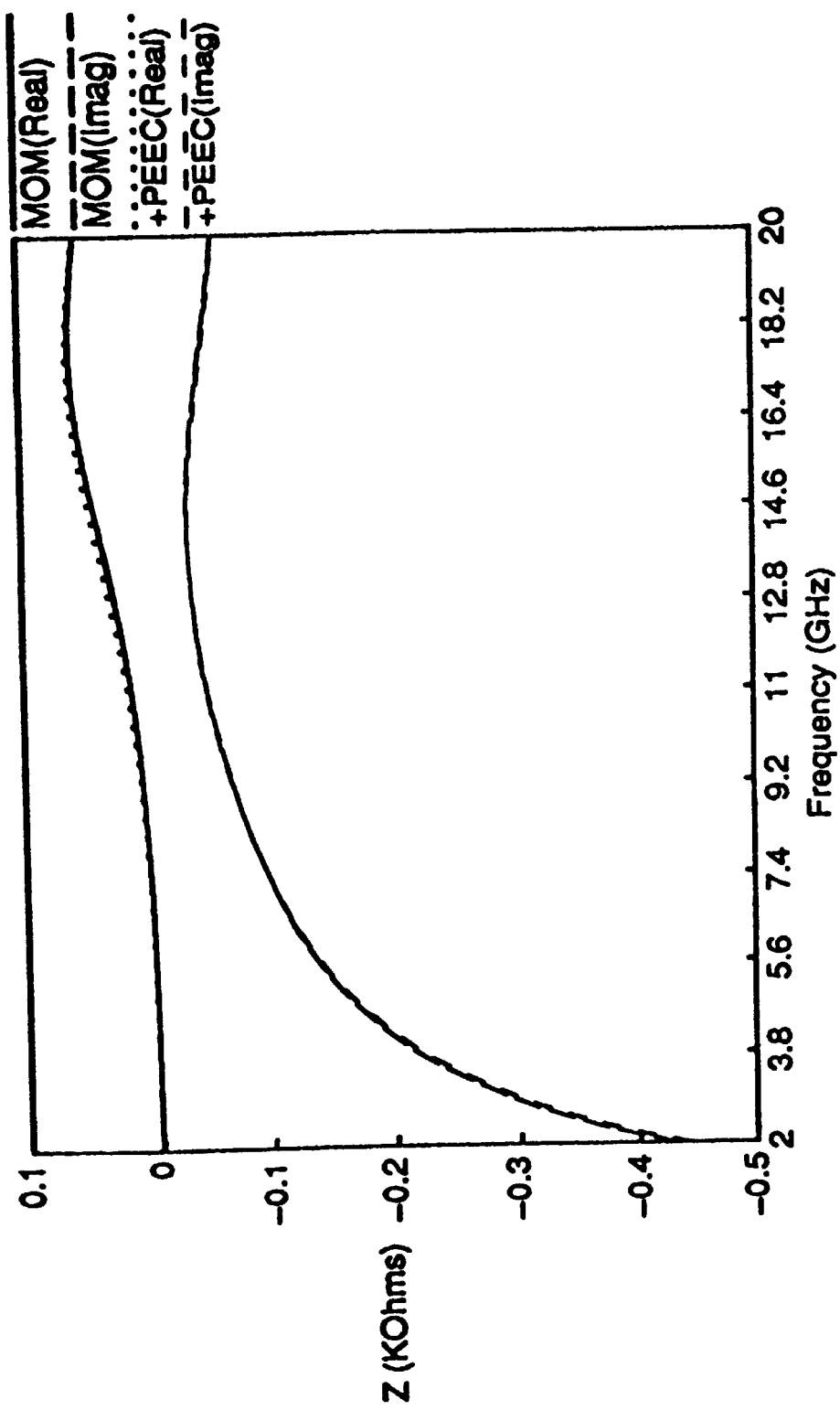
FIGS. 6 through 15 are charts illustrating results of computer experiments of the preferred embodiment for the three different geometries including a patch antenna and two different folded dipole antennas.
Figure 7:
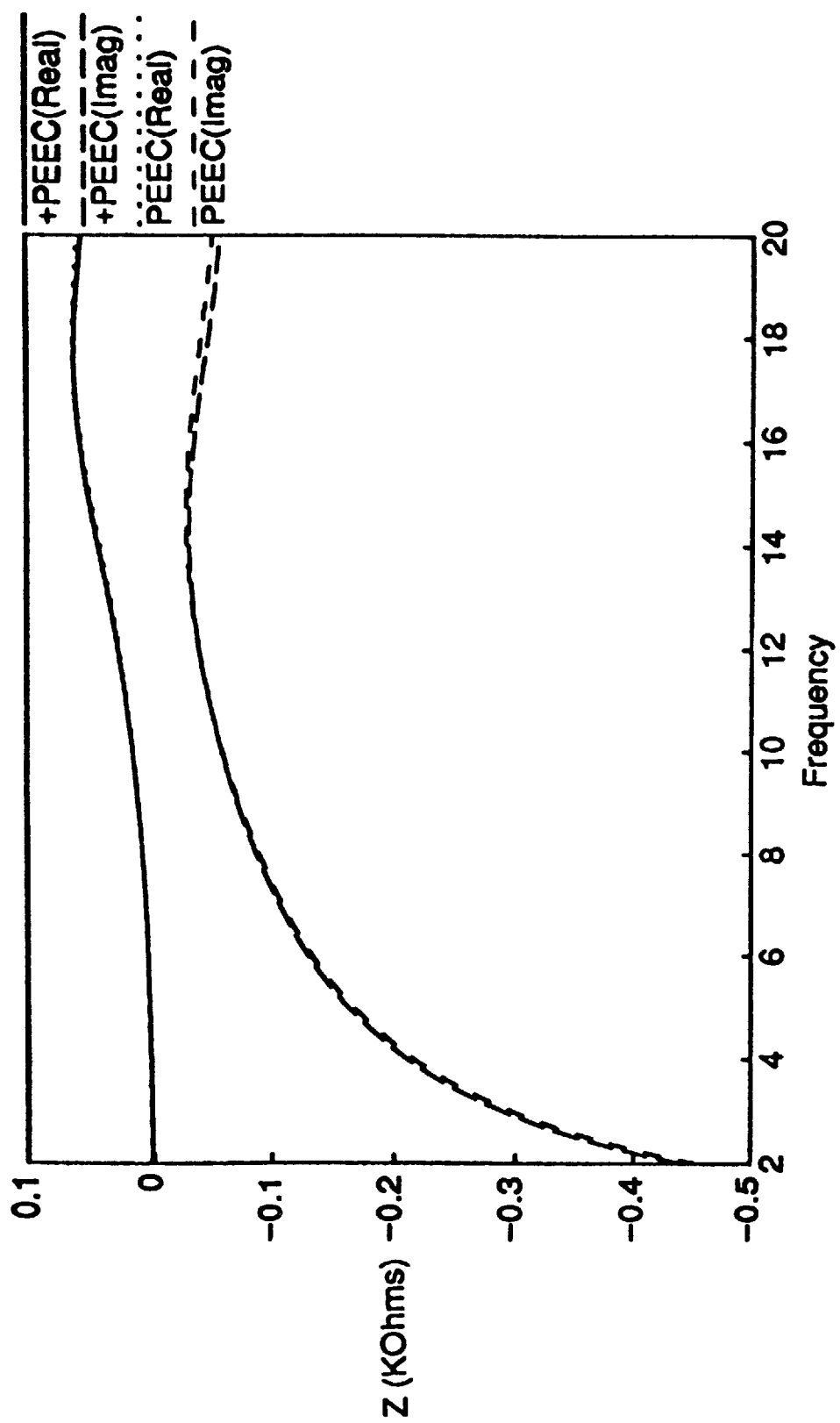

In FIG. 6 the results of the of the +PEEC model is compared with a carefully implemented MoM code. The first comparison is for a patch antenna where the MoM and +PEEC is compared for the active frequency range. The patch antenna is center fed and has a length of 9 mm and a width of 4.5 mm, and is shown in FIG. 5A. The real and imaginary input impedances are shown in FIG. 6 and are in close agreement. The second comparison for the active frequency region is shown in FIG. 7. Again, the same patch antenna is used for a comparison between a basic PEEC model and +PEEC model. In FIG. 7, the same close agreement is shown. Based on these and other examples, both PEEC and +PEEC agree very closely with MoM results in the active frequency range.

Figure 8:
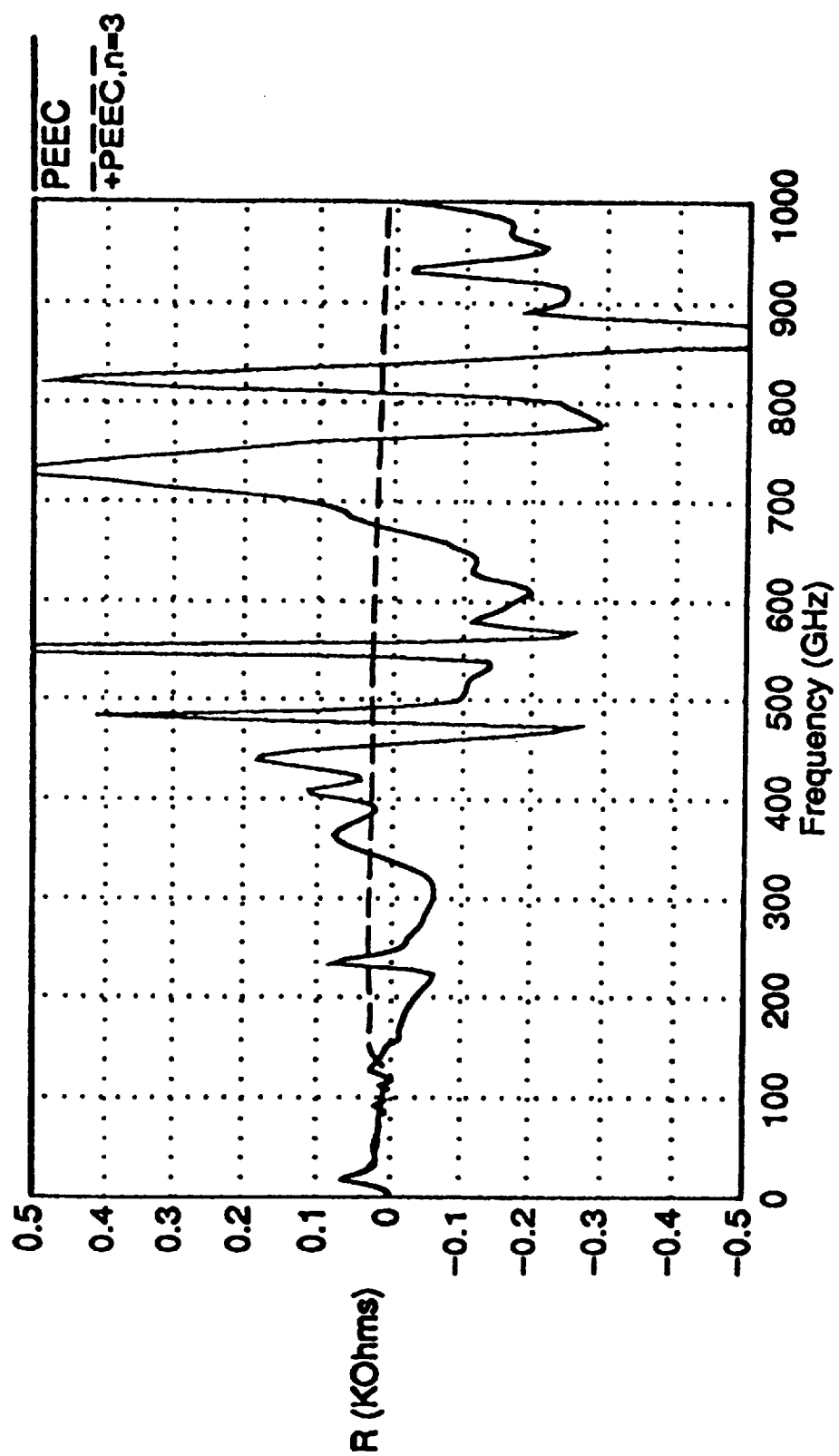
Figure 9:
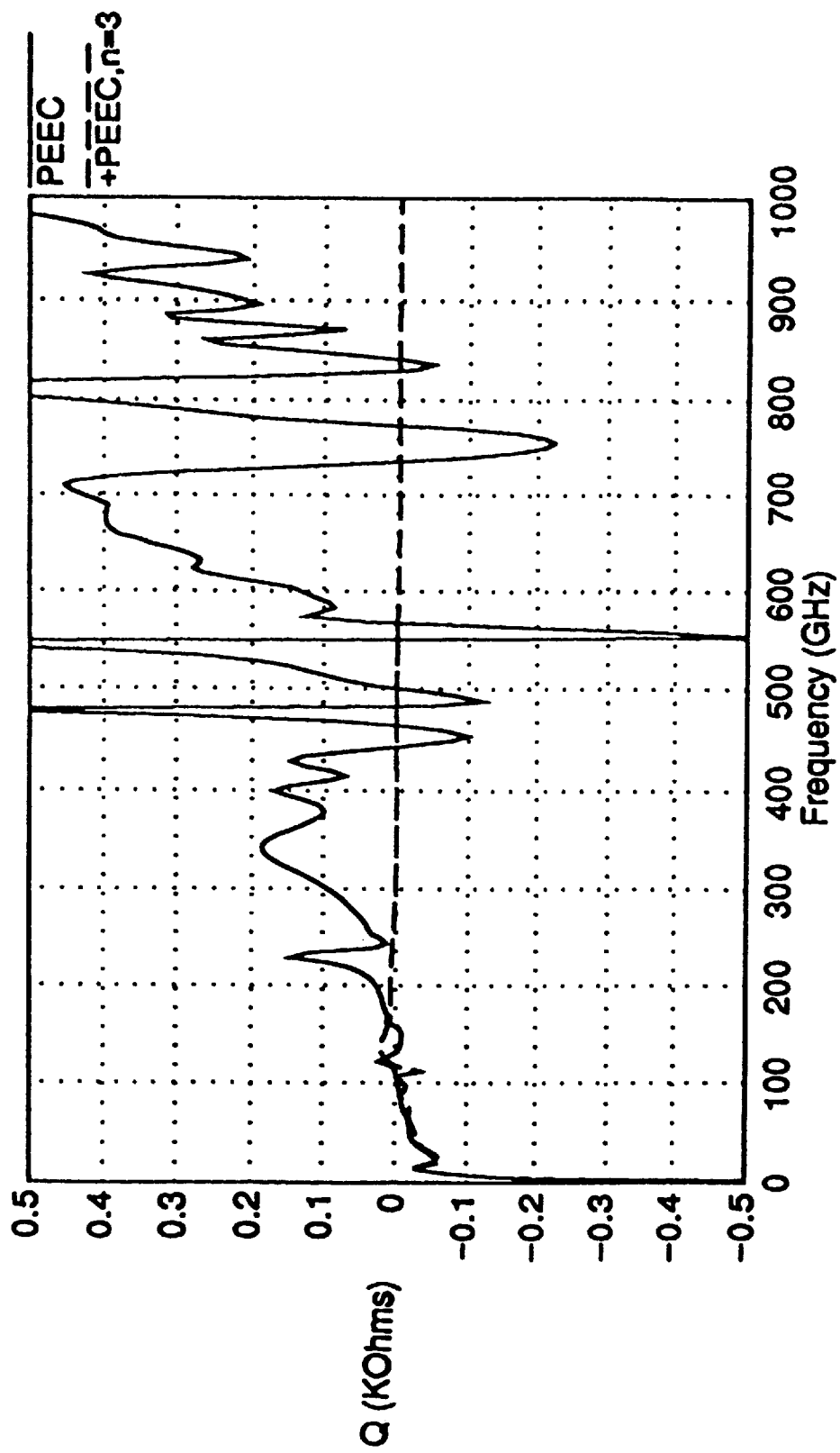

In order to show the effects of the improvements of +PEEC, the input impedance for the same patch antenna at 20 cells/λ at 20 GHz for the extended region is shown. This data is shown in FIGS. 8 and 9 for the real and imaginary input impedances for the patch antenna. This partitioning scheme (+PEEC) has significantly reduced the spurious resonances throughout the extended region.

Figure 10:
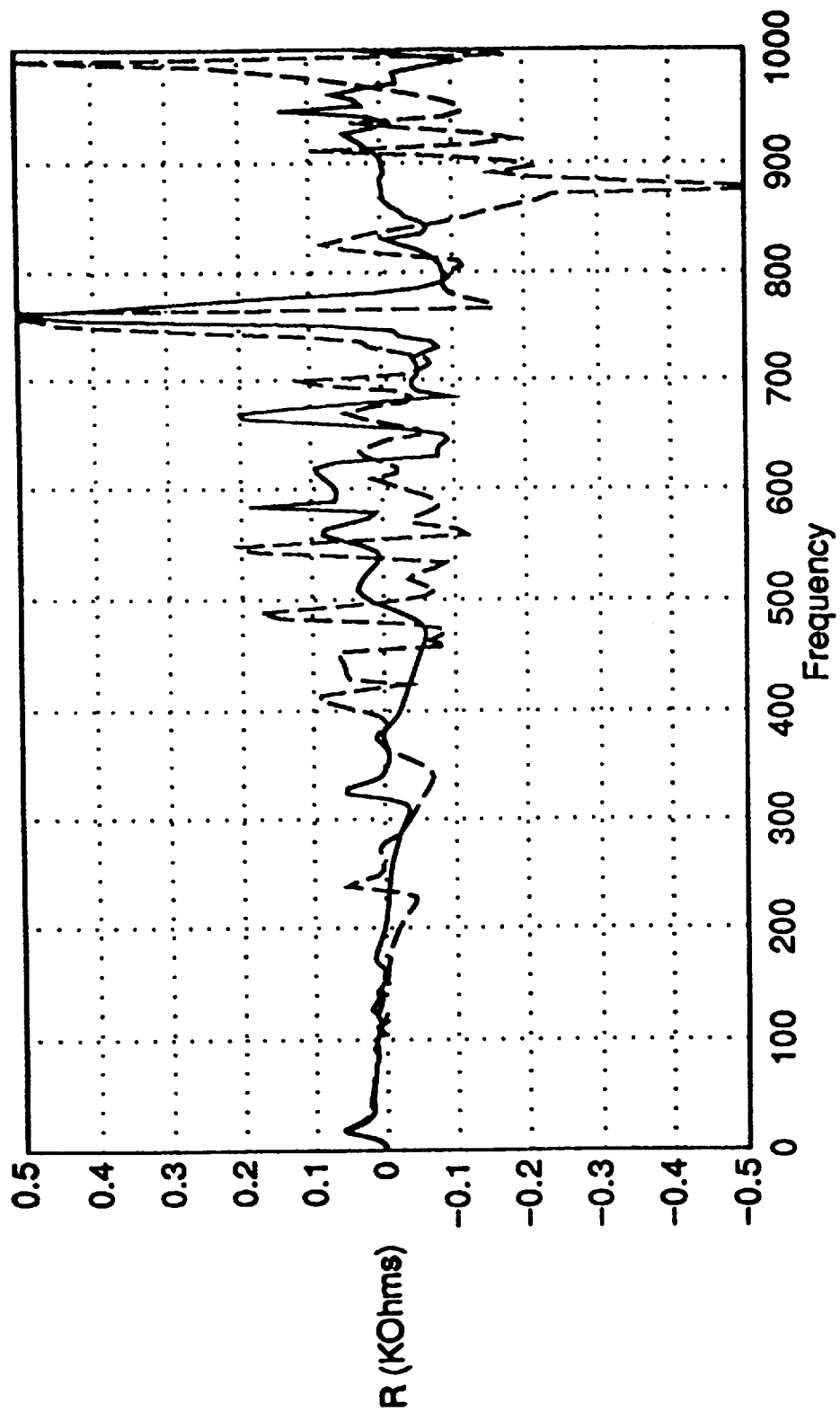

The frequency response above $f_{max}$ is quite surprising for both MoM and PEEC techniques. FIG. 10 shows a comparison of two different discretizations, one is properly discretized for the active region, the other has a few additional cells. This data clearly shows the discretization dependence of the resonance behavior. In addition, these results clearly explain why these models lead to late time instabilities in the time domain.

Figure 11:
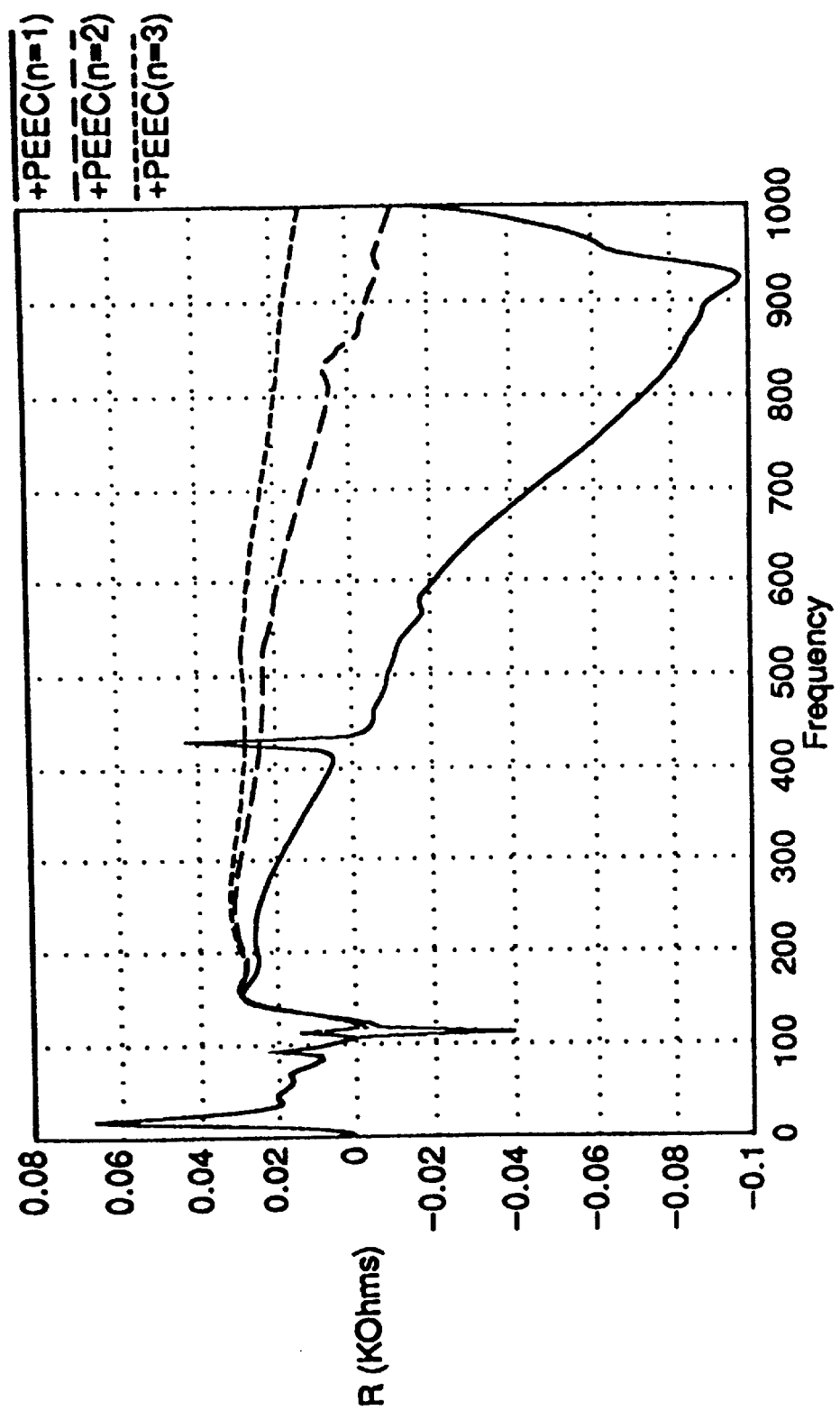
Figure 12:
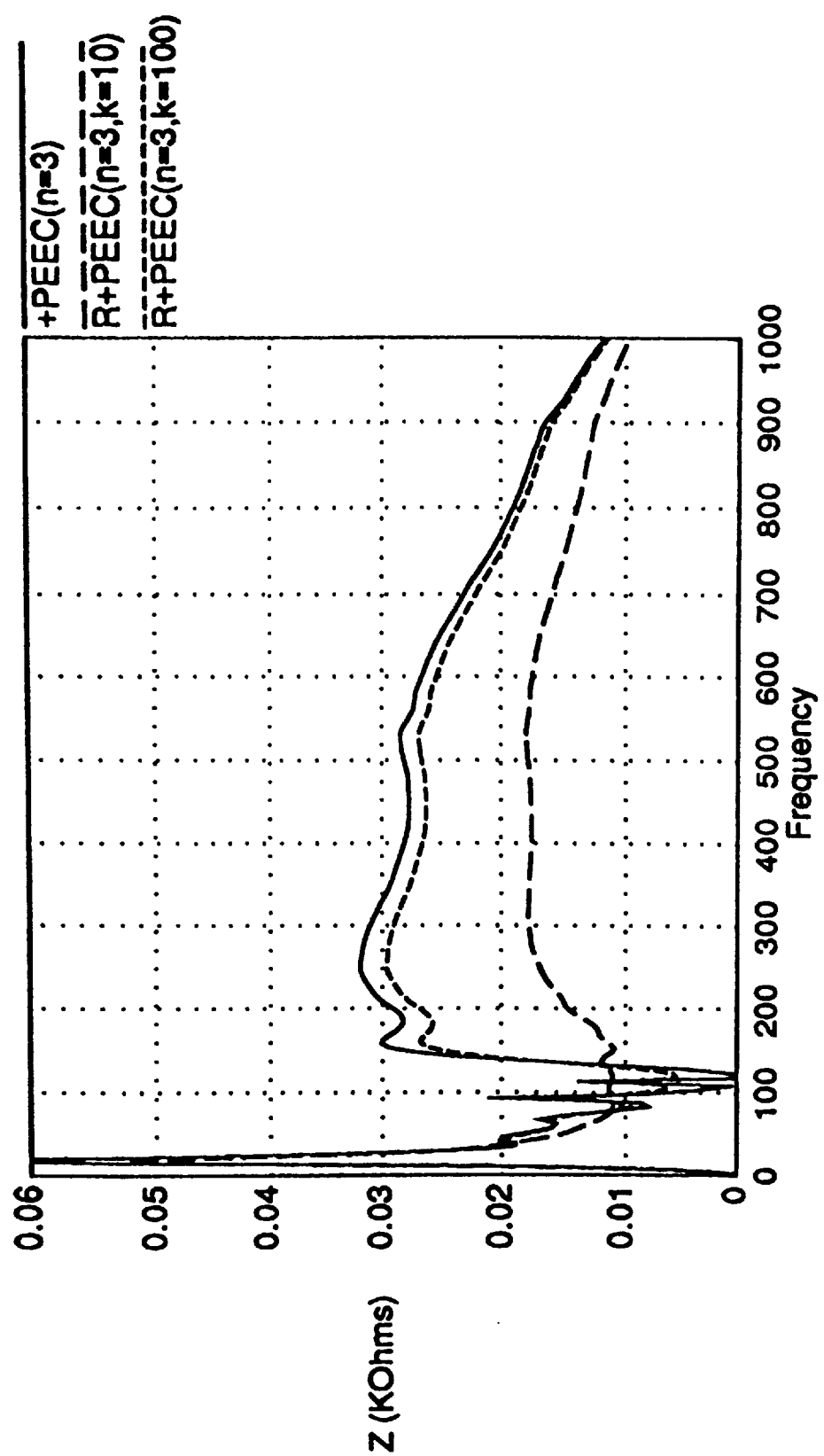

Having reference to FIG. 11, the effects of varying the partitioning scheme in +PEEC are illustrated. The partitioning is varied using n in $$\Delta = \frac{c}{nfe}.$$

In the previous results, n=3 was used. FIG. 11 shows the variation in the real input impedance for n=1, 2, 3. This data clearly illustrates the power of this partitioning technique. For n=1, the real input impedance is positive up to 450 GHz, for n=2 it is positive up to 850 GHz, and for n=3 it is positive up to 1000 GHz. In addition, the negative spike at 100–150 GHz can be eliminated by increasing the number of partitions used.

Next, the impact of the damping resistor is compared (R+PEEC) with the +PEEC model using n=3 partitions. These results are shown for the real input impedance in FIG. 12. It is clear that the R reduces the spike occurring between 100–150 GHz for all selected k values.

Figure 13:
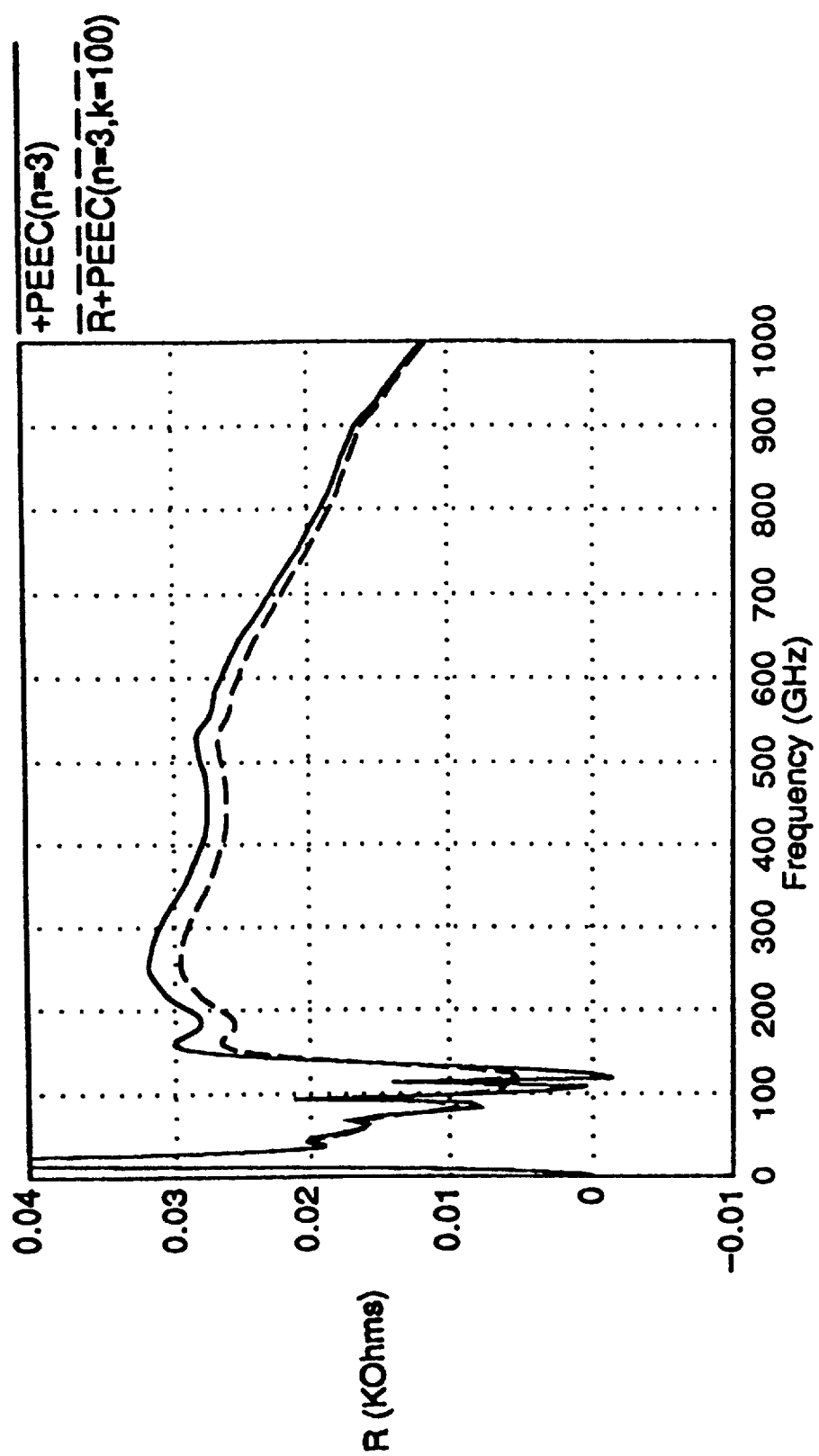

In summary, the results for n=3 both with and without a resistor are shown in FIG. 13. It is clear that the results are stable for the entire extended frequency range for R+PEEC when n=3, k=100. Referring again to FIG. 8, we see the remarkable difference between these results and the original PEEC results before the stabilization of +PEEC of the preferred embodiment.

Figure 14:
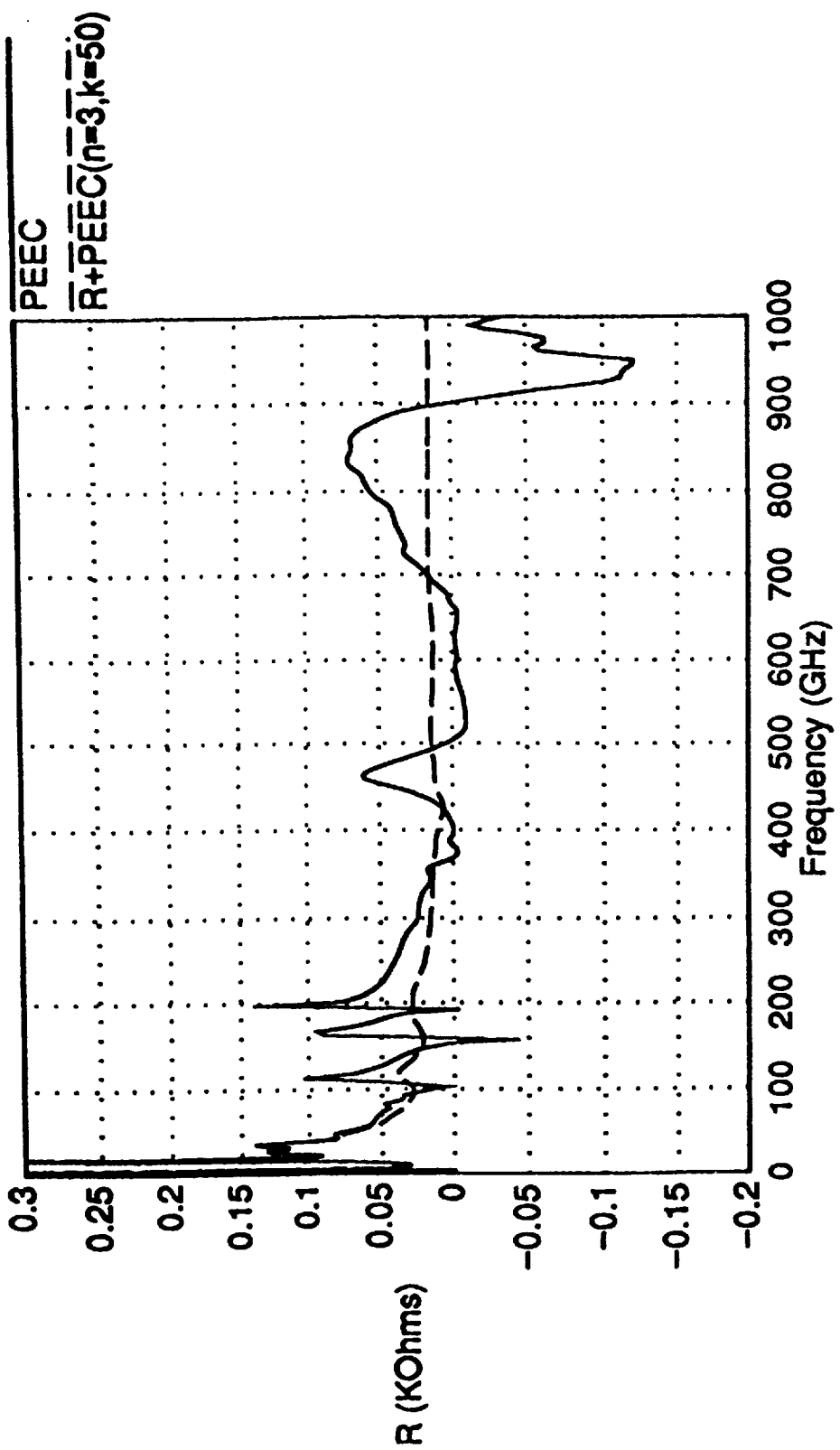

The first folded dipole to be examined is referred to as a loop as shown in FIG. 5B and the loop has an edge to edge length of 9.9 mm, and the loop has an edge to edge width of 5.4 mm. Each flat conductor has a width of 0.9 mm. The results are shown in FIG. 14 for PEEC and R+PEEC (n=3, k=50). It is clear the stabilization scheme has eliminated the false resonances throughout the extended frequency range.

Figure 15:
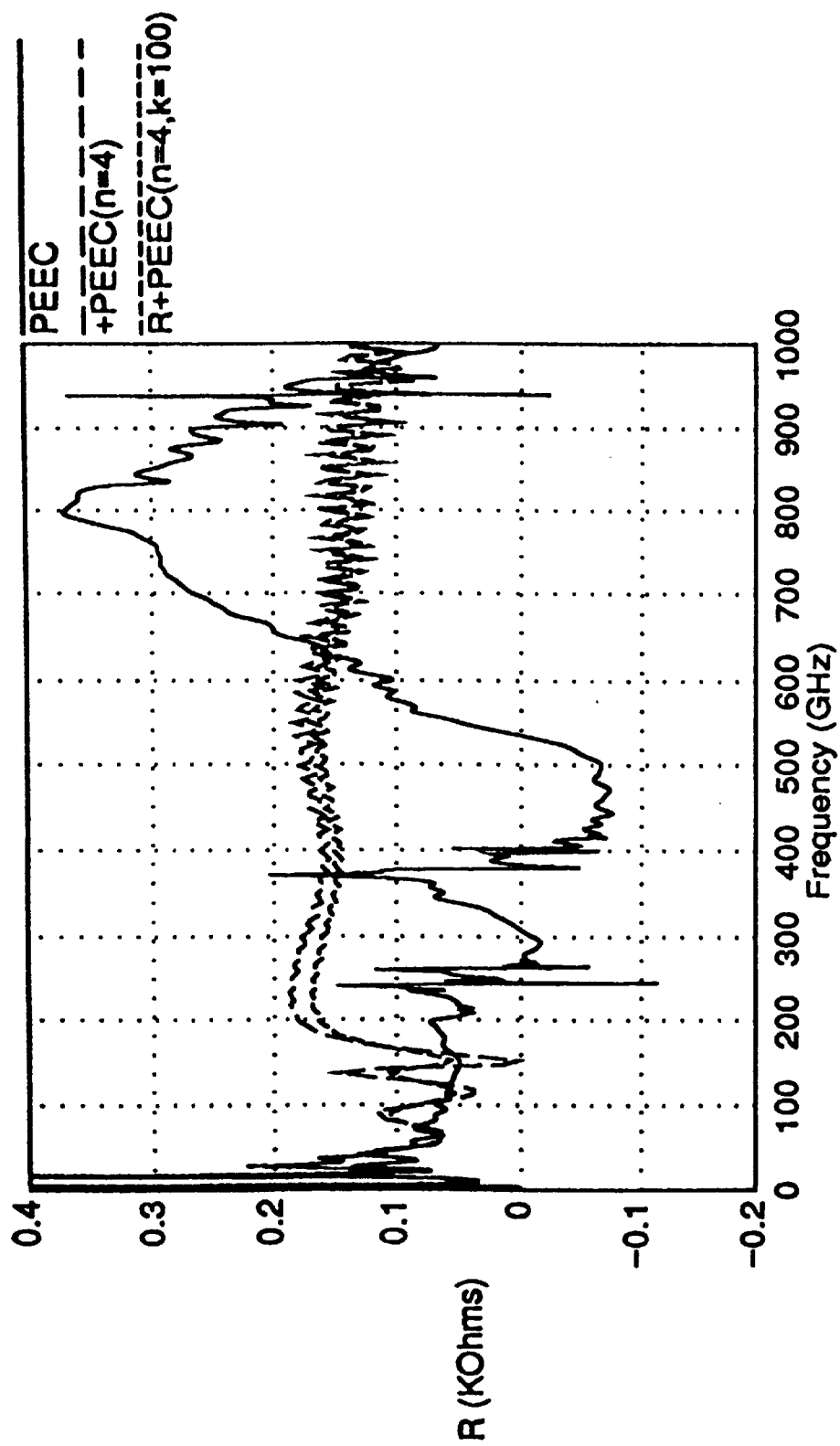

The second folded dipole to be examined is referred to as a ribbon folded dipole as shown in FIG. 5C. The ribbon has an edge to edge length of 9 mm, and an edge to edge width of 4.5 mm. Each flat conductor has a width of 0.9 mm. The number of partitions was selected as n=4 and k=10 was used for the resistor value. A comparison of PEEC, +PEEC, and R+PEEC for the real part of the input impedance is shown in FIG. 15. The results show that the partitioning scheme (+PEEC) provides a stable solution, while the damping resistor (R+PEEC) provides additional smoothing over the extended frequency range.

The false resonances observed explain why the late time instabilities occur for integral equation type models. The process of eliminating these resonances is quite challenging. The solution of the +PEEC, R+PEEC models is assisted by the fact that the PEEC techniques transform the problem into the circuit domain. This allows the use circuit techniques to introduce the damping resistance without increasing the number of unknowns.

In summary, the solution of the preferred embodiment is twofold, implementing the partitioning scheme for the partial inductances and coefficients of potential, and introducing a damping resistor in parallel with each partial inductance. Both the partitioning scheme and the damping resistor are developed in a general sense, such that they are applicable to any geometry. In addition, the parallel resistance may be used to model losses that occur in a real problem. It is observed that many formulations lead to negative input impedances above $f_{max}$ unless the geometry is further discretized into more cells. Increasing the discretization is not very desirable since the number of unknowns is increased drastically which directly impacts the solution time and potentially the size of the problem which can be solved. Also, it is important to observe that the +PEEC improvement techniques of the preferred embodiment are applicable to the time domain formulation as well as to the frequency domain.

Figure 16:
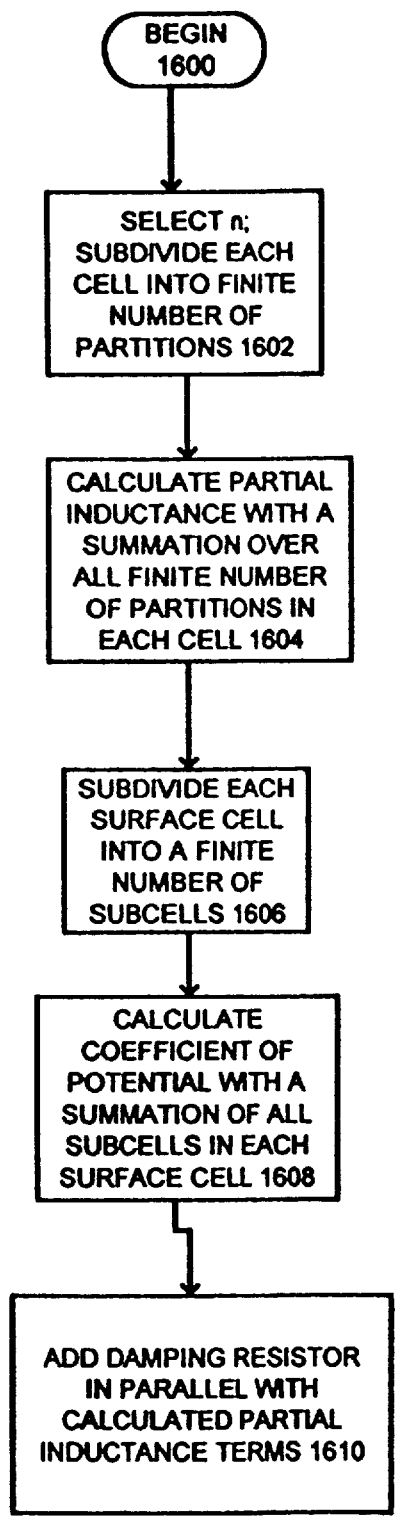
FIG. 16 is a logic flowchart illustrating the method of the preferred embodiment.

Referring to FIG. 16, there are shown exemplary steps according to the teachings of the invention for implementing integral equation models using partial element equivalent circuit (+PEEC) of the preferred embodiment starting at block 1600. First the variable n is selected and each of the cells in a PEEC model are subdivided into a finite number of partitions as indicated at a block 1602. A partial inductance is calculated consisting of a summation over all the finite number of partitions in each cell as indicated at a block 1604. Each surface cell is suddivided into a finite number of subcells as indicated at a block 1606. A coefficient of potential term is calculated consisting of a summation over the finite number of subcells in each surface cell as indicated at a block 1608. Next a damping resistor is added in paralled with the calculated partial inductance term in each cell as indicated at a block 1610.

Figure 17:
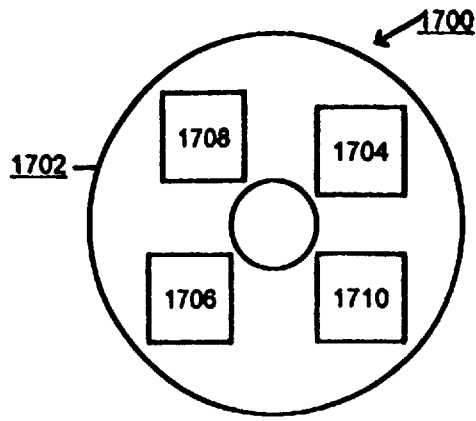
FIG. 17 is a block diagram illustrating a computer program product in accordance with the preferred embodiment.

Referring now to FIG. 17, an article of manufacture or a computer program product 1700 of the invention is illustrated. The computer program product 1700 includes a recording medium 1702, such as, a floppy disk, a high capacity read only memory in the form of an optically read compact disk or CD-ROM, a tape, a transmission type media such as a digital or analog communications link, or a similar computer program product. Recording medium 1702 stores program means 1704, 1706, 1708, 1710, on the medium 1702 for carrying out the methods of the preferred embodiment in the system 100 of FIG. 1.

A sequence of program instructions or a logical assembly of one or more interrelated modules defined by the recorded program means 1704, 1706, 1708, 1710, direct the computer system 100 for implementing integral equation models using partial element equivalent circuit (+PEEC and R+PEEC) of the preferred embodiment.

While the present invention has been described with reference to the details of the embodiments of the invention shown in the drawing, these details are not intended to limit the scope of the invention as claimed in the appended claims.

What is claimed is:

1. A computer program product used in a computer system having a central processor for creating a stable integral equation, Partial Element Equivalent Circuit (PEEC) model for both time and frequency domains using electric field integral equation (EFIE) formulations, magnetic field integral equation (MFIE) formulations, or combined field integral equation (CFIE) formulations, or other integration techniques, the computer program product comprising:

a recording medium;

means, recorded on the recording medium, for subdividing each volume cell into a finite number of partitions;

means, recorded on the recording medium, for calculating a partial inductance term consisting of a summation over all the finite number of partitions in each volume cell;

means, recorded on the recording medium, for subdividing each surface cell into a finite number of subcells;

means, recorded on the recording medium, for calculating a coefficient of potential term consisting of a summation over all the finite number of subcells in each surface cell to create the PEEC model; and means, recorded on the recording medium, for utilizing the created PEEC model for assessing electromagnetic performance.

2. A computer program product for use in a computer system as recited in claim 1 includes means, recorded on the recording medium, for adding a damping resistor in parallel with a calculated partial inductance term in each cell.

3. A computer program product for use in a computer system as recited in claim 2 includes means, recorded on the recording medium, for using a parallel partial inductance and damping resistor impedance term for loop current calculations.

4. A computer program product for use in a computer system as recited in claim 1 where said means, recorded on the recording medium, for calculating said partial inductance term is represented by $$Lp_{ij}^+ = \frac{\mu}{4\pi} \frac{1}{a_i a_j} \sum_{k=1}^{M_i} \sum_{kk=1}^{N_i} \sum_{q=1}^{M_j} \sum_{qq=1}^{N_j} e^{-j\beta R} k, kk, q, \qquad \text{(Eq.21)}$$

$$qq \int_{a_k} \int_{l_{kk}} \int_{a_q} \int_{l_{qq}} \frac{1}{R} dl_{qq} da_q dl_{kk} da_k$$

where cell i is partitioned into $M_i$ by $N_i$ sections and cell j is partitioned into $M_j$ by $N_j$ sections; cell i consists of a total of $M_iN_i$ partitions and cell j consists of a total of $M_jN_j$ partitions and the phase term is taken outside of the integral and is approximated by defining R as the distance between the centroid of partition k,kk and of partition q,qq.

5. A computer program product for use in a computer system as recited in claim 1 wherein said means, recorded on the recording medium, for calculating said coefficient of potential term is represented by $$p_{ij}^+ = \frac{1}{4\pi} \frac{1}{a_i a_j} \sum_{k=1}^{M_i} \sum_{kk=1}^{N_i} \sum_{q=1}^{M_j} \sum_{qq=1}^{N_j} e^{-j\beta R} k, kk, q, \qquad \text{(Eq.22)}$$

$$qq \int_{w_k} \int_{l_{kk}} \int_{w_q} \int_{l_{qq}} \frac{1}{R} dl_{qq} dw_q dl_{kk} dw_k$$

for each pair of cells i and j, where each partition has a width w and length l corresponding to the surface of each partition; cell i is partitioned into $M_i$ by $N_i$ sections and cell j is partitioned into $M_j$ by $N_j$ sections; and the phase term is outside of the integral, but is approximated by defining R as the distance between the centroid of partition k,kk and of partition q,qq.

6. A computer implemented method for creating a stable integral equation, Partial Element Equivalent Circuit (PEEC) model for both the time and frequency domains, using electric field integral equation (EFIE) formulations, magnetic field integral equation (MFIE) formulations, or combined field integral equation (CFIE) formulations, or other integration techniques, said computer implemented method comprising the steps of:

subdividing each volume cell into a finite number of partitions;

calculating a partial inductance term consisting of a summation over all the finite number of partitions in each volume cell;

subdividing each surface cell into a finite number of subcells;

calculating a coefficient of potential term consisting of a summation over all the finite number of subcells in each surface cell to create the PEEC model; and utilizing the created PEEC model for assessing electromagnetic performance.

7. A computer implemented method as recited in claim 6 includes the step of adding a damping resistor in parallel with a calculated partial inductance term in each cell.

8. A computer implemented method as recited in claim 7 includes the step of using a parallel partial inductance and damping resistor impedance term for loop current calculations.

* * * * *